United States Patent [19]

Muterspaugh et al.

[11] Patent Number: 5,034,994
[45] Date of Patent: Jul. 23, 1991

[54] SINGLE BALANCED MIXER WITH OUTPUT FILTER

[75] Inventors: Max W. Muterspaugh, Indianapolis, Ind.; William D. Anderson, Fox River Grove, Ill.

[73] Assignee: RCA Licensing Corporation, Princeton, N.J.

[21] Appl. No.: 337,798

[22] Filed: Apr. 13, 1989

[51] Int. Cl.⁵ .............................................. H04B 1/26
[52] U.S. Cl. .................................... 455/326; 455/189; 455/307; 455/314; 358/191.1
[58] Field of Search ............... 455/324, 325, 326, 205, 455/313, 317, 266, 307, 295, 188, 189, 190, 314; 358/191.1

[56] References Cited

U.S. PATENT DOCUMENTS

| | | | |
|---|---|---|---|
| 3,983,489 | 9/1976 | Gittinger | 325/449 |
| 4,079,415 | 3/1978 | Will | 358/86 |
| 4,340,975 | 7/1982 | Onishi et al. | 455/315 |
| 4,449,245 | 5/1984 | Rabe | 455/319 |
| 4,601,063 | 7/1986 | Price | 455/317 |
| 4,607,394 | 8/1986 | Nightingale | 455/327 |
| 4,633,520 | 12/1986 | Ozazaki | 455/319 |
| 4,811,425 | 3/1989 | Feerst | 455/324 |
| 4,852,123 | 7/1989 | Bickley et al. | 455/324 |

OTHER PUBLICATIONS

"Double Balanced Mixers" appearing on pp. 110-117 of the *Anzac RF and Microwave Components Catalog* for 1984 published by the Anzac Division of Adams-Russel Company Inc. on p. 111 under the subheading of Class IV.

"Reactive Loads-The Big Mixer Menace" by Peter Will appearing on pp. 38-42 of the magazine *Microwave* for Apr. 1971 on p. 1, fifth paragraph and FIG. 1(b).

A technical note of *Anzac Electronics*, pp. 219-223.

*Primary Examiner*—Curtis Kuntz
*Attorney, Agent, or Firm*—Joseph S. Tripoli; Peter M. Emanuel; Frederick A. Wein

[57] ABSTRACT

A balanced mixer and output filter for television receivers and the like is presented. The mixer is followed by a fairly selective bandpass filter to protect the IF amplifiers from first and second adjacent channel signals.

6 Claims, 3 Drawing Sheets

SINGLE BALANCED MIXER WITH OUTPUT FILTER

The present invention concerns single balanced mixers, and more particularly a single balanced mixer and an output filter for a television receiver or the like providing reduced generation of unwanted frequency components and improved rejection of adjacent channel frequencies.

BACKGROUND

A mixer is a three port network which translates an incoming signal at one frequency to some other intermediate frequency. To affect this translation, the incoming signal is heterodyned or mixed in a non-linear device usually with another signal generated by local oscillator. This process generates two primary intermediate frequency signals, having frequencies which are equal to the sum and difference of the incoming signal frequency and the local oscillator frequency. However, other unwanted frequency components and products are also generated as well as the mixing of adjacent channel frequencies which also takes place.

Single or double balanced mixers when used in the tuners of television receivers have several advantages over active mixers which often use bipolar or MOSFET transistors for the VHF band and a single Schottky diode for the UHF band. These advantages include improved channel 6 beat performance, improved cross-modulation performance, improved half-IF performance, partial cancellation of local oscillator energy at the signal input port, and sufficiently wide bandwidth for use of one mixer over a plurality of bands, such as UHF and VHF. One of the reasons for these advantages of a passive mixer over an active mixer is that for an active mixer the unwanted cross-modulation products, intermodulation products and harmonics are amplified during the modulation process and it is then too late to do much beneficial filtering.

In many television receivers the IF stages comprise a surface acoustic wave (SAW) filter which provides excellent selectivity without requiring the alignment of coils but has a large insertion loss of the order of 20 db. Accordingly, it is often the practice to provide about 20-26 db amplification prior to the SAW filters to make up for this insertion loss in order to have the level of the output signal from the SAW be no lower than the signal output level from the mixer in order to maintain a satisfactory signal to noise ratio. Since the tuner RF bandpass filter circuits have relatively wider bandwidth than a single channel, substantial adjacent channel signal is present in the output of the mixer and is fed to the SAW preamplifier.

This adjacent channel signal causes increased cross modulation and intermodulation products in the mixer which are aggrevated in an active mixer. Additionally, this adjacent channel signal when applied to the SAW preamp can overload the SAW preamp or at least adds sufficient extraneous signal level to drive the SAW preamp through a larger dynamic response characteristic and thus increase the distortion of the preamp. However, even if such a preamp is not used, it is still desirable to protect the IF stages from this extraneous signal for reducing the dynamic range of the IF stages and thus reduce the distortion products.

The adjacent channel signals present more of a problem for the VHF television channels of channels 2-13 than for the UHF channels primarily because the UHF stations broadcast with at least 6 channels of separation in any particular market area. In such a case, even though the UHF tuners use a single Schottky diode as a mixer with a following bandpass filter, such tuners are not balanced and thus do not provide the lower cross-modulation, intermodulation, and harmonic products achievable with a balanced mixer in the VHF band.

Accordingly, it is desirable to provide a passive mixer such as a single or double balanced mixer for a television receiver wherein the unwanted frequency components, harmonics of the fundamental signals, and distortion products conveyed to the IF stages are reduced.

As used herein, the term television receiver includes television processing apparatus without limitation as to the presence or absence of a video display, e.g., a television set, a VCR, etc.

SUMMARY OF THE INVENTION

The present invention concerns a mixer and output filter used in the tuner of a television receiver or the like. The mixer is a single balanced mixer for producing an intermediate frequency output signal from an input RF signal and a local oscillator signal. A fairly selective bandpass filter in addition to the usual IF filter is coupled to the output of the mixer for filtering the output signal in order to protect the IF amplifiers from first and second adjacent channel signals and undesirable distortion products.

DESCRIPTION OF THE DRAWINGS

For a better understanding of the present invention, reference should be made to be accompanying drawings wherein.

DETAILED DESCRIPTION OF THE PREFERRED EMBODIMENT

Figure 1:
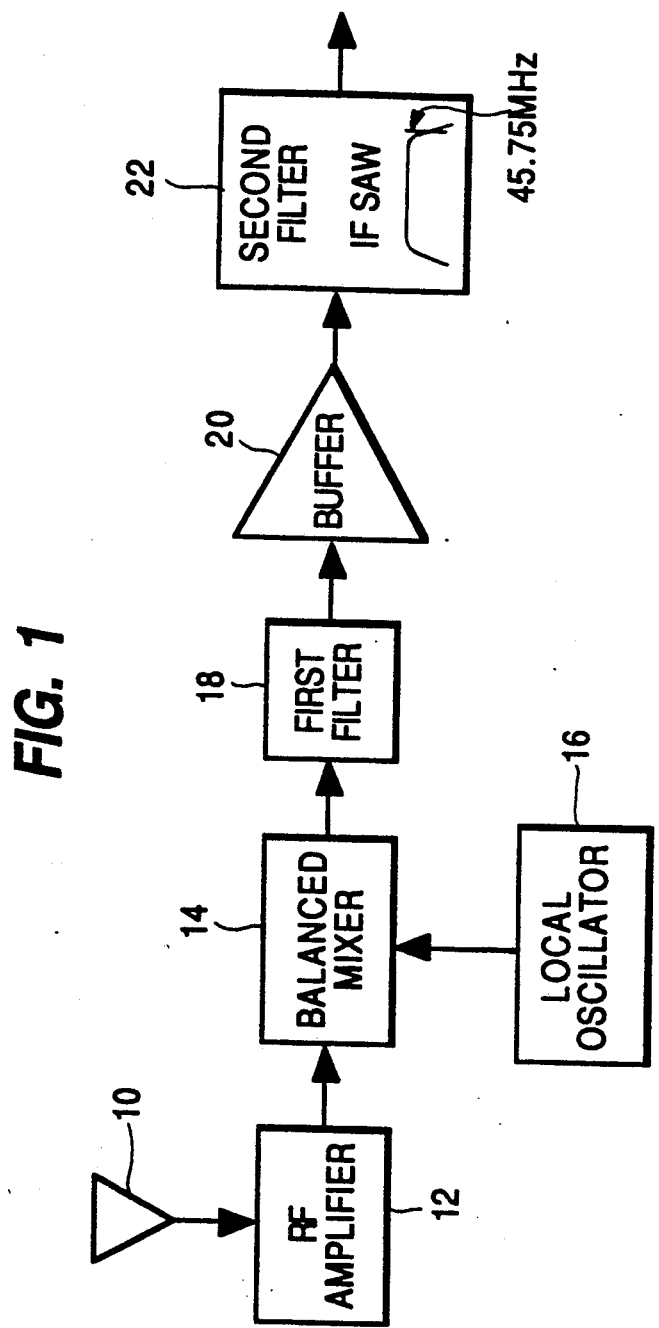
FIG. 1 is a block diagram representation including one embodiment of the present invention.

Referring now to the drawings wherein like reference numerals have been applied to like members, FIG. 1 shows a single or double balanced mixer 14, receiving RF signals received at antenna 10 which are coupled to an RF amplifier 12 in which the RF signal corresponding to the selected channel is selected. A local oscillator 16 generating a signal having a frequency corresponding to the selected channel is coupled to mixer 14. Mixer 14 combines the selected RF signal and the local oscillator signal to produce an output signal having sum and difference frequency components. The output signal of mixer 14 is coupled to first bandpass filter 18 which in turn is subsequently coupled to an IF section or second bandpass filter 22, through a buffer or amplifier 20. The buffer 20 is optional, and when used can provide isolation, impedance matching between first filter 18 and second filter 22 and/or signal gain particularly if a surface acoustic wave (SAW) filter is used in the IF section.

IF section 22 is a standard IF stage which can include SAW filters, single or double tuned filter sections, and amplifiers. The output of filter 22 is fed at 23 to appropriate detectors (not shown) for video and sound demodulation.

The frequency of the local oscillator signal for each channel is controlled so that, as in the exemplary embodiment, the difference component is in the passband of the subsequent IF section 22 which, for example, in the United States is approximately between 41 and 46 MHz and typically has sound and picture carrier frequencies at 41.25 MHz and 45.75 MHz, respectively.

Figure 2:
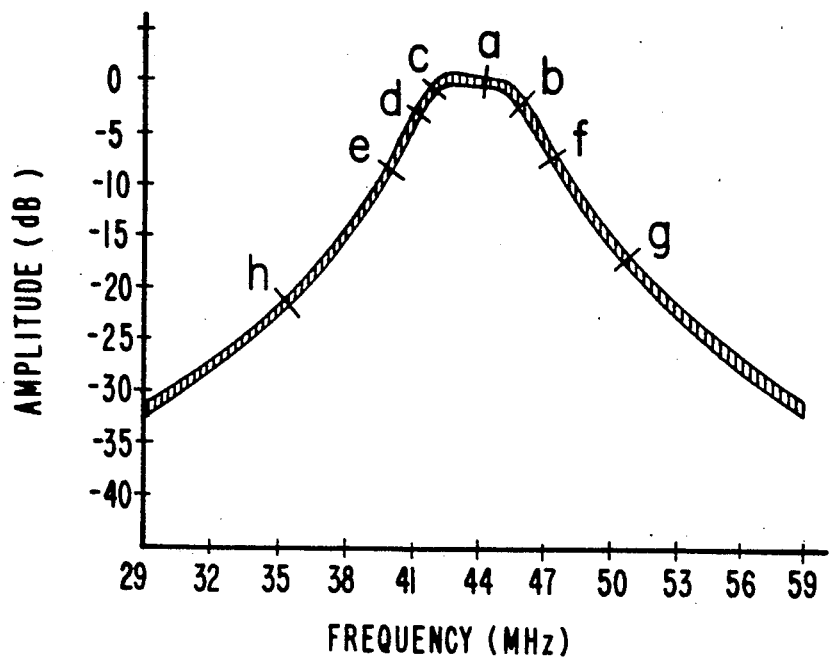
FIG. 2 is a graphic representation of the amplitude vs. frequency passband response of first filter of FIG. 1.

Referring now to FIG. 2, there is shown a graph of the amplitude vs. frequency response of the first bandpass filter 18. Marker "a" is the crest of the response curve at the center of the IF passband and is at a 0 db reference level. Marker "b" is the picture carrier at 45.75 MHz and is down 1 db, marker "c" is the chroma sub-carrier at 42.17 MHz and is down 1 db, marker "d" is the sound carrier at 41.25 MHz and is at a level of −3 db, marker "e" at 39.75 MHz is the first adjacent picture carrier at −9 db, marker "f" at 47.25 MHz is the first adjacent sound carrier at −6.35 db, marker "g" at 51.7 MHz is the second adjacent picture carrier at −19.8 db, and marker "h" at 35.25 MHz is the second adjacent sound carrier at −21.9 db.

The RF amplifier 12 and mixer 14 have essentially a flat response over this frequency range. Thus, as shown in FIG. 2, the first and second adjacent picture and sound carriers are substantially rejected and not passed onto the IF section or second bandpass filter 22 for the reasons and beneficial effects discussed hereinabove.

Figure 3:
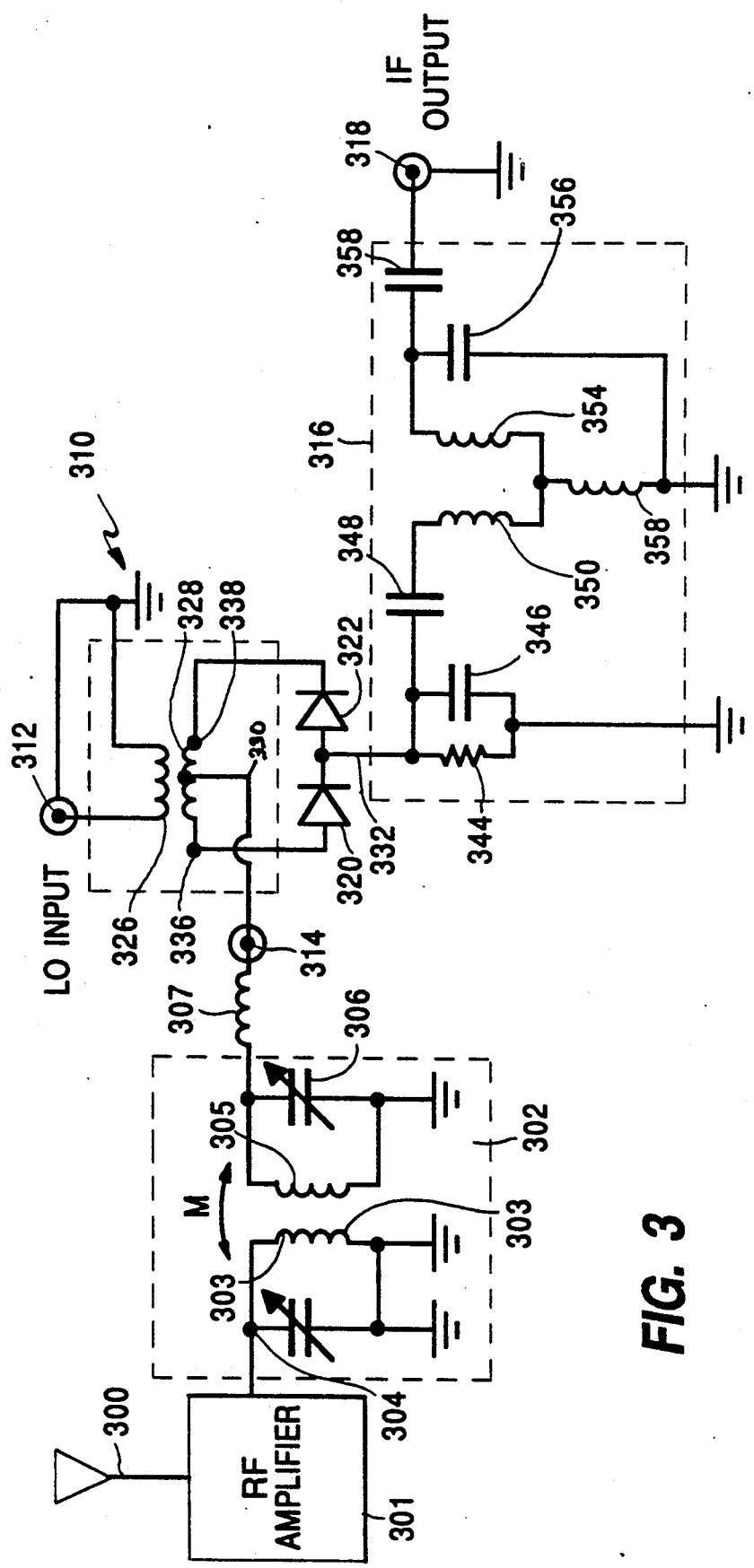
FIG. 3 is a schematic representation of a television tuner including an embodiment of the present invention.

Referring now to FIG. 3, there is shown an exemplary tuner for a television set, FM radio receiver, or the like. For an exemplary range of frequencies, e.g., including the VHF and UHF bands, the RF input signal is derived from an antenna 300 or any equivalent source. The signal from antenna 300 is then amplified in RF amplifier 301 which can be any amplifier common in the art. The output of amplifier 301 is fed to a tank circuit 302 having a primary coil 303 tuned with a primary capacitor 304, e.g., a varactor diode, and a secondary coil 305 tuned with a secondary capacitor 306, e.g., also a varactor diode with an appropriate mutual coupling between coils 303 and 305. The output from the tank circuit 302 is then fed through impedance matching inductance 307 to RF input 314 coupled to secondary winding 328 of transformer 324 comprising a balanced input of mixer 310 which corresponds to mixer 14 of FIG. 1. A local oscillator signal is coupled to the primary 326 of transformer 324 of mixer 310.

Mixer 310 is a single balanced mixer having a pair of diodes 320 and 322 as the mixing elements and a transformer 324 having a primary winding 326 and a secondary winding 328 having a center tap 330. Transformer 324 can be either a closely coupled RF transformer well known in the art or alternatively, a balun having, e.g., a 50 ohm unbalanced or single ended input and a balanced or double-ended 200 ohm secondary with a center tap. When transformer 324 is a balun, it contains pairs of bifilar wires wound around a ferrite core and connected in a conventional fashion to provide the impedance transformation between the unbalanced (single ended) input and the balanced (doubled ended) output fed to diodes 320 and 322. Diodes 320 and 322 are non-linear unidirectional current conducting devices connected in series with each other at an output terminal 332 and coupled across and poled for unidirectional current conduction between terminals 36 and 38 of secondary winding 328. In the exemplary embodiment diodes 320 and 322 are Schottky diodes. The intermediate frequency signal at terminal 332 is then coupled to bandpass filter 316 which corresponds to first bandpass filter 18 of FIG. 1.

Filter 316 is more selective than the usual IF filters in tuners and protects succeeding IF amplifiers from many of the undesired mixer products as well as first and second adjacent channels which can cause distortion products in subsequent amplifier stages. A double tuned filter, which in the exemplary embodiment is a Butterworth filter, having a center bandpass frequency of 44 MHz with a bandpass of 45.75 MHz and 42.17 MHz has been shown to be suitable. This filter 316 substantially improves the harmonic and distortion characteristics of mixer 310.

The structure of bandpass filter 316 and comprises in the exemplary embodiment for television use a double tuned Butterworth filter although filters of greater selectivity can be used, e.g., triple tuned. Resistor 344 of e.g., 330 ohms, is connected from output terminal 332 of mixer 310 to ground in parallel with capacitor 346, e.g., 330 picofarads (pf). A capacitor 348, e.g., 320 picofarads, couples the output signal from terminal 332 to a "pi" configuration of inductances 350 and 354, e.g., each 120 nanohenries (nhy) and inductance 352, e.g., 10–15 nhy, with inductance 352 providing the coupling between inductances 350 and 352. Capacitor 356, e.g., 68 pf, couples the output end of inductance 354 to ground and the signal is fed through capacitor 358, e.g., 47 pf, to IF output terminal 318.

The filter 316 protects the subsequent IF amplifiers from the first and second adjacent channel signals for reducing distortion products in said subsequent amplifiers as well as reducing harmonic products in mixer 310 by maintaining high circuit impedances at the frequencies of the unwanted signals.

While it has been illustrated and described what is at present considered to be a preferred embodiment of the present invention, it will be appreciated that numerous changes and modifications are likely to occur to those skilled in the art and it is intended in the appended claims to cover all the changes and modifications which fall within the spirit and scope of the present invention.

What is claimed is:

1. In a television receiver, apparatus comprising:
   an RF stage for supplying an RF signal corresponding to a selected channel and undesirably capable of supplying an RF signal corresponding to at least a portion of one channel adjacent to said selected channel;
   a local oscillator for generating a local oscillator signal;
   a passive mixer for combining said selected RF signal and said local oscillator signal to provide an IF signal;
   a bandpass filter coupled to said passive mixer without any intervening device capable of mixing or amplifying, said bandpass filter including at least a doubly tuned section for filtering the output signal of said passive mixer;
   an amplifier coupled to said first bandpass filter for amplifying the output signal of said first bandpass filter; and
   a television IF filter coupled to said amplifier for filtering the output signal of said amplifier to produce a filtered IF signal suitable for demodulation.

2. The apparatus of claim 1 wherein the last mixer is a single balanced mixer.

3. The apparatus of claim 2 further comprising a RF amplifier for amplifying the RF signals and feeding the amplified RF signals to the mixer.

4. The apparatus of claim 1 wherein the bandpass filter is configured as a Butterworth filter.

5. The apparatus of claim 1 wherein the television IF filter comprises a surface acoustic wave filter.

6. In a television receiver, apparatus comprising:
- an RF stage for supplying an RF signal corresponding to a selected channel and undesirably capable of supplying an RF signal corresponding to at least a portion of one channel adjacent to said selected channel;
- a local oscillator for generating a local oscillator signal;
- a balanced passive mixer for combining said selected RF signal and said local oscillator signal to provide an IF signal;
- a bandpass filter coupled to said passive mixer without any intervening device capable of mixing or amplifying, said bandpass filter including at least a doubly tuned section for filtering the output signal of said passive mixer;
- an amplifier coupled to said first bandpass filter for amplifying the output signal of said first bandpass filter; and
- a television IF filter coupled to said amplifier for filtering the output signal of said amplifier to produce a filtered IF signal suitable for demodulation.

* * * * *